US011247567B2

(12) United States Patent
Morimoto et al.

(10) Patent No.: US 11,247,567 B2
(45) Date of Patent: Feb. 15, 2022

(54) SEMICONDUCTOR RELAY CONTROL DEVICE

(71) Applicant: Yazaki Corporation, Tokyo (JP)

(72) Inventors: Mitsuaki Morimoto, Shizuoka (JP); Eiichiro Oishi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 203 days.

(21) Appl. No.: 16/842,011

(22) Filed: Apr. 7, 2020

(65) Prior Publication Data

US 2020/0231042 A1 Jul. 23, 2020

Related U.S. Application Data

(63) Continuation of application No. PCT/JP2018/026845, filed on Jul. 18, 2018.

(30) Foreign Application Priority Data

Nov. 8, 2017 (JP) .............................. JP2017-215314

(51) Int. Cl.
*B60L 3/00* (2019.01)
*H02H 7/20* (2006.01)
(Continued)

(52) U.S. Cl.
CPC ................ *B60L 3/00* (2013.01); *H02H 7/20* (2013.01); *H02J 7/345* (2013.01); *H03K 17/687* (2013.01)

(58) Field of Classification Search
CPC .. B60L 3/00; B60L 3/023; B60L 3/046; B60L 2270/20; H02H 3/087; H02H 7/20;
(Continued)

(56) References Cited

U.S. PATENT DOCUMENTS

2010/0214055 A1* 8/2010 Fuji ........................... B60L 3/04
340/3.1
2010/0263960 A1* 10/2010 Nagase .................. H02M 1/32
180/443
(Continued)

FOREIGN PATENT DOCUMENTS

JP 2011-166938 A 8/2011
JP 2015-100241 A 5/2015
(Continued)

OTHER PUBLICATIONS

International Search Report for PCT/JP2018/026845 dated Oct. 16, 2018 [PCT/ISA/210].

*Primary Examiner* — Kevin J Comber
(74) *Attorney, Agent, or Firm* — Sughrue Mion, PLLC

(57) ABSTRACT

An FET makes an upstream power supply circuit an energized state and makes the upstream power supply circuit an interrupted state. An FET makes a downstream power supply circuit an energized state and makes the downstream power supply circuit an interrupted state. An FET turns on to make an anode and a cathode of the capacitor an energized state, and turns off to make the anode and the cathode an interrupted state. A controller turns on the FET and the FET and turns off the FET to make a power supply circuit an energized state. When a certain discharge request is input in the energized state of the power supply circuit, the controller turns off the FET and turns on the FET and the FET. With this configuration, a semiconductor relay device can appropriately address the power supply circuit at the time of abnormality.

6 Claims, 8 Drawing Sheets

(51) Int. Cl.
*H02J 7/34* (2006.01)
*H03K 17/687* (2006.01)

(58) Field of Classification Search
CPC ......... H02H 9/002; H03K 17/687; H02J 1/00; H02J 7/0031; H02J 7/345; H02J 2310/48
USPC .......................................................... 361/42
See application file for complete search history.

(56) References Cited

U.S. PATENT DOCUMENTS

| | | | | |
|---|---|---|---|---|
| 2012/0326531 | A1* | 12/2012 | Kawamoto | H02J 7/0031 307/130 |
| 2013/0116871 | A1* | 5/2013 | Hashimoto | B60L 50/51 701/22 |
| 2014/0095005 | A1 | 4/2014 | Kanzaki et al. | |
| 2016/0303948 | A1* | 10/2016 | Sakai | B60L 3/0023 |

FOREIGN PATENT DOCUMENTS

| | | | | |
|---|---|---|---|---|
| JP | 2016-092962 | A | | 5/2016 |
| JP | 2016092962 | A | * | 5/2016 |
| JP | 2017-190022 | A | | 10/2017 |
| JP | 2017190022 | A | * | 10/2017 |
| WO | 2012/164680 | A1 | | 12/2012 |

* cited by examiner

SEMICONDUCTOR RELAY CONTROL DEVICE

CROSS-REFERENCE TO RELATED APPLICATION

This application is a continuation application of International Application PCT/JP2018/026845, filed on Jul. 18, 2018 which claims the benefit of priority from Japanese Patent application No. 2017-215314 filed on Nov. 8, 2017 and designating the U.S., the entire contents of which are incorporated herein by reference.

BACKGROUND OF THE INVENTION

1. Field of the Invention

The present invention relates to a semiconductor relay control device.

2. Description of the Related Art

Electric vehicles or hybrid electric vehicles have conventionally been equipped with a power supply circuit having a high voltage load part such as an inverter and a high voltage battery for driving the high voltage load part in some cases. This power supply circuit is provided with an interrupting circuit passing or interrupting a current passing from the high voltage battery to the high voltage load part for the purpose of security. Although mechanical relays are often used for this interrupting circuit, in recent years, semiconductor relays have been used in some cases (e.g., Japanese Patent Application Laid-open No. 2016-092962).

The interrupting circuit of Japanese Patent Application Laid-open No. 2016-092962 described above may become a state in which electric charges are charged to a capacitor of the high voltage load part at the time of abnormality such as a vehicle collision, for example, and thus there is room to further improve in this regard.

SUMMARY OF THE INVENTION

Given these circumstances, the present invention has been made in view of the above, and an object thereof is to provide a semiconductor relay control device that can appropriately address the power supply circuit at the time of abnormality.

In order to solve the above mentioned problem and achieve the object, a semiconductor relay control device according to one aspect of the present invention includes an upstream semiconductor relay connected, in an upstream power supply circuit, in a circuit in which a load part including a capacitor and a DC power supply are connected to each other, the circuit being a power supply circuit in which the capacitor is connected in parallel to the DC power supply, between a positive electrode of the DC power supply and the load part, in series to between the positive electrode and the load part, turning on to make the upstream power supply circuit an energized state, and turning off to make the upstream power supply circuit an interrupted state; a downstream semiconductor relay connected, in a downstream power supply circuit between a negative electrode of the DC power supply and the load part, in series to between the negative electrode and the load part, turning on to make the downstream power supply circuit an energized state, and turning off to make the downstream power supply circuit an interrupted state; a semiconductor relay for discharge connected in parallel to the capacitor, turning on to make an anode and a cathode of the capacitor an energized state, and turning off to make the anode and the cathode an interrupted state; a diode that is provided so as to have a current passing direction opposite to a direction in which a current passes from the DC power supply to the load part and is connected in parallel to the semiconductor relay for discharge; and a controller controlling the upstream semiconductor relay, the downstream semiconductor relay, and the semiconductor relay for discharge, wherein the controller turns on the upstream semiconductor relay and the downstream semiconductor relay and turns off the semiconductor relay for discharge to make the power supply circuit an energized state and, when the power supply circuit is short-circuited, the controller turns off the upstream semiconductor relay and the semiconductor relay for discharge and turns on the downstream semiconductor relay, a negative surge voltage caused by the turning off of the upstream semiconductor relay is clamped by the diode.

According to another aspect of the present invention, in the semiconductor relay control device, it is preferable that when a certain discharge request is input in the energized state of the power supply circuit, the controller turns off the upstream semiconductor relay and turns on the downstream semiconductor relay and the semiconductor relay for discharge.

According to still another aspect of the present invention, in the semiconductor relay control device, it is preferable that the controller controls the semiconductor relay for discharge to regulate a current passing through the semiconductor relay for discharge.

In order to achieve the object, a semiconductor relay control device according to still another aspect of the present invention includes an upstream semiconductor relay connected, in an upstream power supply circuit, in a circuit in which a load part including a capacitor and a DC power supply are connected to each other, the circuit being a power supply circuit in which the capacitor is connected in parallel to the DC power supply, between a positive electrode of the DC power supply and the load part, in series to between the positive electrode and the load part, turning on to make the upstream power supply circuit an energized state, and turning off to make the upstream power supply circuit an interrupted state; a downstream semiconductor relay connected, in a downstream power supply circuit between a negative electrode of the DC power supply and the load part, in series to between the negative electrode and the load part, turning on to make the downstream power supply circuit an energized state, and turning off to make the downstream power supply circuit an interrupted state; a semiconductor relay for discharge connected in parallel to the capacitor, turning on to make an anode and a cathode of the capacitor an energized state, and turning off to make the anode and the cathode an interrupted state; a precharge circuit having a series circuit in which a resistor and a semiconductor relay for precharge are connected in series to each other, the series circuit being connected in parallel to the downstream semiconductor relay, passing a current through the series circuit by the turning on of the semiconductor relay for precharge, and not passing any current through the series circuit by the turning off of the semiconductor relay for precharge; a diode that is provided so as to have a current passing direction opposite to a direction in which a current passes from the DC power supply to the load part and is connected in parallel to the semiconductor relay for discharge; and a controller controlling the upstream semiconductor relay, the downstream semiconductor relay, the semiconductor relay for discharge, and the semiconductor relay for precharge, wherein the controller turns on the upstream semiconductor relay and the downstream semiconductor relay and turns off the semiconductor relay for discharge and the semiconductor relay for precharge to make the power supply circuit an energized state and, when the power supply circuit is short-circuited, the controller turns off the upstream semiconductor relay and the semiconductor relay for discharge and turns on the downstream semiconductor relay, a negative surge voltage caused by the turning off of the upstream semiconductor relay is clamped by the diode.

According to still another aspect of the present invention, in the semiconductor relay control device, it is preferable that when a certain discharge request is input in the energized state of the power supply circuit, the controller turns off the upstream semiconductor relay and the downstream semiconductor relay and turns on the semiconductor relay for precharge and the semiconductor relay for discharge.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
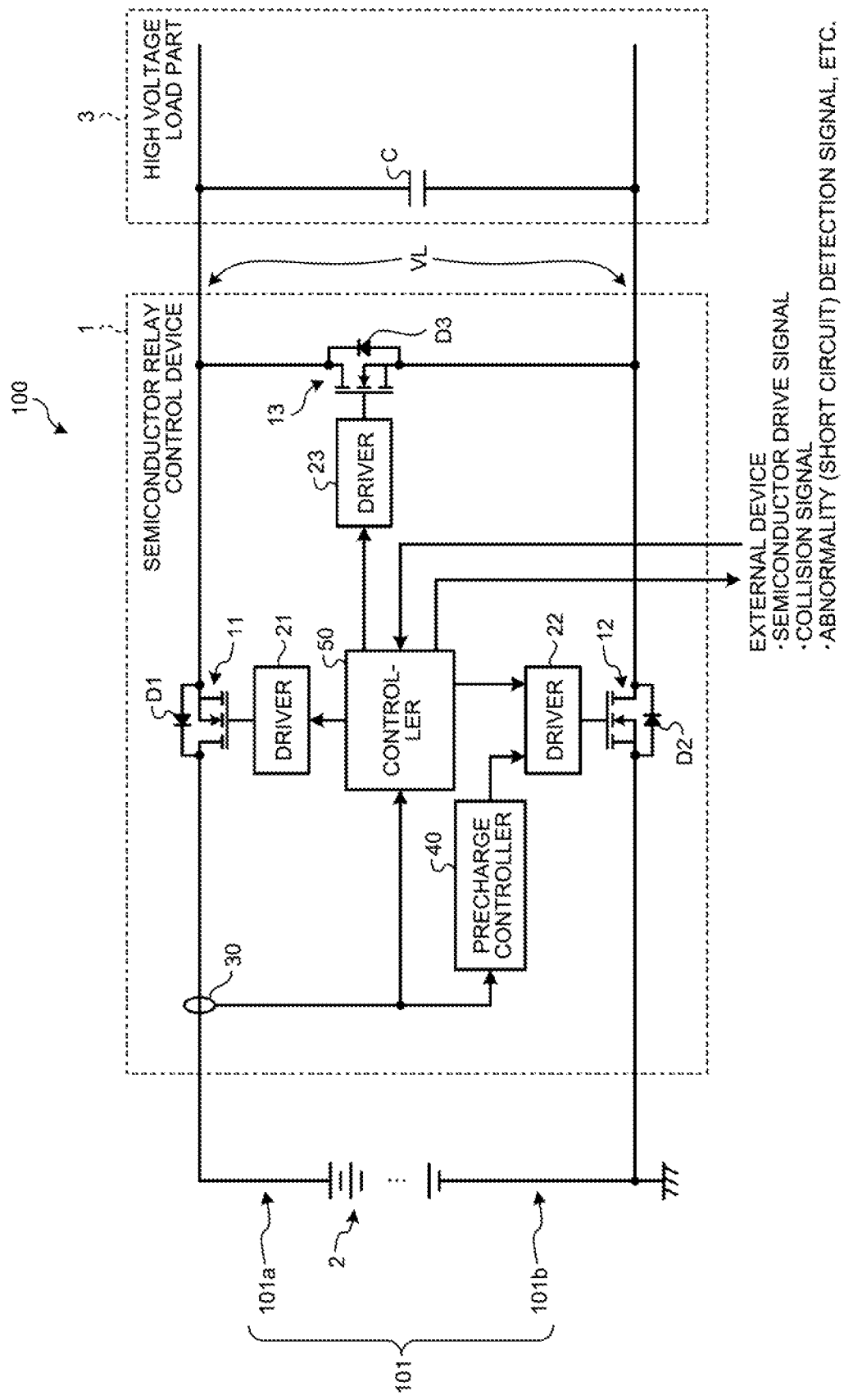
FIG. 1 is a circuit diagram of a configuration example of a semiconductor relay control device according to a first embodiment.

The following describes modes (embodiments) for performing the present invention in detail with reference to the accompanying drawings. The details described in the following embodiments do not limit the present invention. The following components include ones that those skilled in the art can easily think of and substantially the same ones. Furthermore, the following configurations can be combined with each other as appropriate. Various omissions, replacements, or modifications of the configurations can be made without departing from the gist of the present invention.

First Embodiment

The following describes a semiconductor relay control device 1 according to a first embodiment. A vehicle such as an electric vehicle or a hybrid electric vehicle is provided with a high voltage system 100 supplying power supply power from a high voltage battery 2 to a high voltage load part 3 to drive the high voltage load part 3, for example. This high voltage system 100 includes the high voltage battery 2 as a DC power supply, the high voltage load part 3 as a load part, and the semiconductor relay control device 1. The high voltage system 100 forms a power supply circuit 101 in which the high voltage battery 2 and the high voltage load part 3 are electrically connected to each other via the semiconductor relay control device 1.

The high voltage battery 2 is a chargeable/dischargeable high voltage secondary battery and includes a lithium-ion battery pack or a nickel-hydride battery pack including a plurality of batteries connected to each other, for example. The high voltage battery 2 has a terminal voltage of a few hundred volts, for example. The high voltage battery 2 is connected to the high voltage load part 3 via the semiconductor relay control device 1 to supply power to the high voltage load part 3.

The high voltage load part 3 is a high voltage load part and is an inverter, which converts a direct current into an alternating current to supply power to a drive motor, for example. The high voltage load part 3 is connected to the high voltage battery 2 via the semiconductor relay control device 1. The high voltage load part 3 has a capacitor C, and the capacitor C is connected in parallel to the high voltage battery 2. The high voltage load part 3 converts DC power supplied from the high voltage battery 2 into AC power and supplies the AC power to a drive motor, for example.

The semiconductor relay control device 1 is an interrupting device (a power supply box) passing or interrupting a current passing from the high voltage battery 2 to the high voltage load part 3 for the purpose of security. The semiconductor relay control device 1 performs precharge control to pass a precharge current through the power supply circuit 101 in order to prevent a rush current into the high voltage load part 3. After the precharge control, the semiconductor relay control device 1 passes a current larger than the precharge current through the power supply circuit 101. As illustrated in FIG. 1, the semiconductor relay control device 1 includes a field-effect transistor (FET) 11 as an upstream semiconductor relay, an FET 12 as a downstream semiconductor relay, a driver 21, a driver 22, a current detector 30, a precharge controller 40, an FET 13, and a controller 50.

The FET 11 is a switching element passing or interrupting the current passing from the high voltage battery 2 to the high voltage load part 3. The FET 11 is provided in an upstream power supply circuit 101a between a positive electrode of the high voltage battery 2 and the high voltage load part 3. The FET 11 is connected in series to between the positive electrode of the high voltage battery 2 and the high voltage load part 3. The FET 11 is an N-channel type metal-oxide-semiconductor (MOS) FET, for example. The FET 11 has a gate terminal, a drain terminal, and a source terminal. The gate terminal of the FET 11 is connected to the driver 21, the drain terminal thereof is connected to the positive electrode of the high voltage battery 2, and the source terminal thereof is connected to the high voltage load part 3. In the FET 11, an ON voltage is applied to the gate terminal, whereby a current (also called a drain current) passes between the drain and the source. In the FET 11, an OFF voltage is applied to the gate terminal, whereby no current passes between the drain and the source. In the FET 11, a body diode (a parasitic diode) D1 is arranged in an orientation opposite to a direction in which the current (the drain current) passes. A cathode terminal of the body diode D1 is connected to the drain terminal of the FET 11, whereas an anode terminal thereof is connected to the source terminal of the FET 11. The FET 11 is driven by the driver 21 described below to turn on, thereby making the upstream power supply circuit 101a an energized state and thus passing a current from the positive electrode of the high voltage battery 2 to the high voltage load part 3. The FET 11 is driven by the driver 21 to turn off, thereby making the upstream power supply circuit 101a an interrupted state and thus interrupting the current passing from the positive electrode of the high voltage battery 2 to the high voltage load part 3.

The FET 12 is a switching element passing or interrupting a current passing from the high voltage load part 3 to the high voltage battery 2. The FET 12 is provided in a downstream power supply circuit 101b between a negative electrode of the high voltage battery 2 and the high voltage load part 3. The FET 12 is connected in series to between the negative electrode of the high voltage battery 2 and the high voltage load part 3. The FET 12 is an N-channel type MOSFET, for example. The FET 12 has a gate terminal, a drain terminal, and a source terminal. The gate terminal of the FET 12 is connected to the driver 22, the drain terminal thereof is connected to the high voltage load part 3, and the source terminal thereof is connected to the negative electrode of the high voltage battery 2. In the FET 12, an ON voltage is applied to the gate terminal, whereby a current passes between the drain and the source. In the FET 12, an OFF voltage is applied to the gate terminal, whereby no current passes between the drain and the source. In the FET 12, a body diode D2 is arranged in an orientation opposite to a direction in which the current (the drain current) passes. A cathode terminal of the body diode D2 is connected to the drain terminal of the FET 12, whereas an anode terminal thereof is connected to the source terminal of the FET 12. The FET 12 is driven by the driver 22 described below to turn on, thereby making the downstream power supply circuit 101b an energized state and thus passing a current from the high voltage load part 3 to the negative electrode of the high voltage battery 2. The FET 12 is driven by the driver 22 to turn off, thereby making the downstream power supply circuit 101b an interrupted state and thus interrupting the current passing from the high voltage load part 3 to the negative electrode of the high voltage battery 2. The FET 12 performs control to pass the precharge current through the power supply circuit 101 when the power supply circuit 101 is started up.

The driver 21 is a circuit turning on or off the FET 11. The driver 21 is connected to the controller 50 and the gate terminal of the FET 11. When an upstream semiconductor drive signal (ON) is output from the controller 50, the driver 21 applies an ON voltage to the gate terminal of the FET 11 to pass a current between the drain and the source of the FET 11. When an upstream semiconductor drive signal (OFF) is output from the controller 50, the driver 21 applies an OFF voltage to the gate terminal of the FET 11 to interrupt the current passing between the drain and the source of the FET 11.

The driver 22 is a circuit turning on or off the FET 12. The driver 22 is connected to the controller 50 and the gate terminal of the FET 12. When a downstream semiconductor drive signal (ON) is output from the controller 50, the driver 22 applies an ON voltage to the gate terminal of the FET 12 to pass a current between the drain and the source of the FET 12. When a downstream semiconductor drive signal (OFF) is output from the controller 50, the driver 22 applies an OFF voltage to the gate terminal of the FET 12 to interrupt the current passing between the drain and the source of the FET 12. The driver 22 is further connected to the precharge controller 40 and applies an ON voltage for precharge to the gate terminal of the FET 12 based on control by the precharge controller 40 to pass the precharge current between the drain and the source of the FET 12.

The current detector 30 is a detector detecting a current passing between the high voltage battery 2 and the high voltage load part 3. The current detector 30 is a Hall type current sensor including a Hall element as a magnetoelectric conversion element, for example, and detects a current in a noncontact manner. The current detector 30 detects a current passing between the positive electrode of the high voltage battery 2 and the FET 11, for example, and outputs the detected current (a detection current) to the controller 50 and the precharge controller 40. The current detector 30 may be a shunt type current sensor, which detects a current based on a voltage drop occurring by the resistance of a shunt resistor, a VDS type current sensor, which detects a current based on a voltage drop occurring in the FET 11, or the like.

The precharge controller 40 performs precharge control, which avoids a rush current passing from the high voltage battery 2 to the high voltage load part 3. The precharge controller 40 performs precharge control on either the FET 11 or the FET 12. In this example, the precharge controller 40 performs precharge control on the FET 12. The precharge controller 40 controls the gate voltage of the FET 12 to pass the precharge current from the high voltage battery 2 to the high voltage load part 3. The precharge controller 40, upon start-up of the power supply circuit 101, applies an ON voltage for precharge to the gate terminal of the FET 12 via the driver 22 to pass the precharge current from the high voltage battery 2 to the high voltage load part 3, for example. The precharge controller 40 passes a certain precharge current only during a period in which the capacitor C of the high voltage load part 3 is charged, for example.

The FET 13 is a switching element discharging electric charges charged to the capacitor C. The FET 13 is connected in parallel to the capacitor C. The FET 13 is an N-channel type MOSFET, for example. The FET 13 has a gate terminal, a drain terminal, and a source terminal. The gate terminal of the FET 13 is connected to the driver 23, the drain terminal thereof is connected to the anode of the capacitor C, and the source terminal is connected to the cathode of the capacitor C. In the FET 13, an ON voltage is applied to the gate terminal, whereby a current passes between the drain and the source. In the FET 13, an OFF voltage is applied to the gate terminal, whereby no current passes between the drain and the source. In the FET 13, the gate terminal, the drain terminal, and the source terminal function as a semiconductor relay for discharge. In the FET 13, a body diode D3 as a diode is arranged in an orientation opposite to a direction in which the current (the drain current) passes. A cathode terminal of the body diode D3 is connected to the positive electrode of the high voltage battery 2, whereas an anode terminal thereof is connected to the negative electrode of the high voltage battery 2. In other words, the cathode terminal of the body diode D3 is connected to the drain terminal of the FET 13, whereas the anode terminal thereof is connected to the source terminal of the FET 13. The FET 13 is driven by the driver 23 described below to turn on, thereby making the anode and the cathode of the capacitor C an energized state and thus enabling the electric charges charged to the capacitor C to be discharged. The FET 13 is driven by the driver 23 to turn off, thereby making the anode and the cathode of the capacitor C an interrupted state and thus disabling the electric charges charged to the capacitor C to be discharged.

The driver 23 is a circuit turning on or off the FET 13. The driver 23 is connected to the controller 50 and the gate terminal of the FET 13. When a semiconductor-for-discharge drive signal (ON) is output from the controller 50, the driver 23 applies an ON voltage to the gate terminal of the FET 13 to pass a current between the drain and the source of the FET 13. When a semiconductor-for-discharge drive signal (OFF) is output from the controller 50, the driver 23 applies an OFF voltage to the gate terminal of the FET 13 to interrupt the current passing between the drain and the source of the FET 13.

The controller 50 controls the FET 11, the FET 12, and the FET 13. The controller 50 includes an electronic circuit consisting principally of a well-known microcomputer including a central processing unit (CPU), a read only memory (ROM) and a random access memory (RAM) forming a storage unit, and an interface. The controller 50 is connected to the driver 21 to control the FET 11 via the driver 21. The controller 50 outputs the upstream semiconductor drive signal (ON) to the driver 21 to turn on the FET 11 and outputs the upstream semiconductor drive signal (OFF) to the driver 21 to turn off the FET 11, for example. The controller 50 is connected to the driver 22 to control the FET 12 via the driver 22. The controller 50 outputs the downstream semiconductor drive signal (ON) to the driver 22 to turn on the FET 12 and outputs the downstream semiconductor drive signal (OFF) to the driver 22 to turn off the FET 12, for example. The controller 50 is connected to a driver 23 to control the FET 13 via the driver 23. The controller 50 outputs the semiconductor-for-discharge drive signal (ON) to the driver 23 to turn on the FET 13 and outputs the semiconductor-for-discharge drive signal (OFF) to the driver 23 to turn off the FET 13, for example.

The controller 50 turns on or off the FETs 11 to 13 in accordance with a request from an external device such as a host electronic control unit (ECU), for example. The controller 50 turns on or off the FETs 11 to 13 based on a semiconductor drive signal (an external signal) output from this external device, for example. A semiconductor drive signal (ON) is a signal indicating turning on the FETs 11 and 12, whereas a semiconductor drive signal (OFF) is a signal indicating turning off the FETs 11 and 12. When the semiconductor drive signal (ON) is output, the controller 50 turns on the FETs 11 and 12 and turns off the FET 13 to make the power supply circuit 101 an energized state, for example. When the semiconductor drive signal (OFF) is output, the controller 50 turns off the FETs 11 to 13 to make the power supply circuit 101 an interrupted state.

In addition, the controller 50 turns on or off the FETs 11 to 13 based on a collision signal (an external signal) output from the external device. A collision signal (collision) is a signal indicating that the vehicle has collided, whereas a collision signal (normal) is a signal indicating that the vehicle has not collided. When the collision signal (collision) is output, the controller 50 turns off the FET 11 and turns on the FETs 12 and 13 to discharge the electric charges charged to the capacitor C, for example. When the collision signal (normal) is output, the controller 50 turns on the FETs 11 and 12 and turns off the FET 13 to make the power supply circuit 101 an energized state, thus not discharging the electric charges charged to the capacitor C.

In addition, the controller 50 determines a short circuit based on the detection current output from the current detector 30. When determining a short circuit, the controller 50 turns off the FETs 11 and 13 and turns on the FET 12 to interrupt a short circuit current and to reduce a negative surge voltage caused by the turning off of the FET 11. When not determining a short circuit, the controller 50 turns on the FETs 11 and 12 and turns on the FET 13 to make the power supply circuit 101 an energized state.

Figure 2:
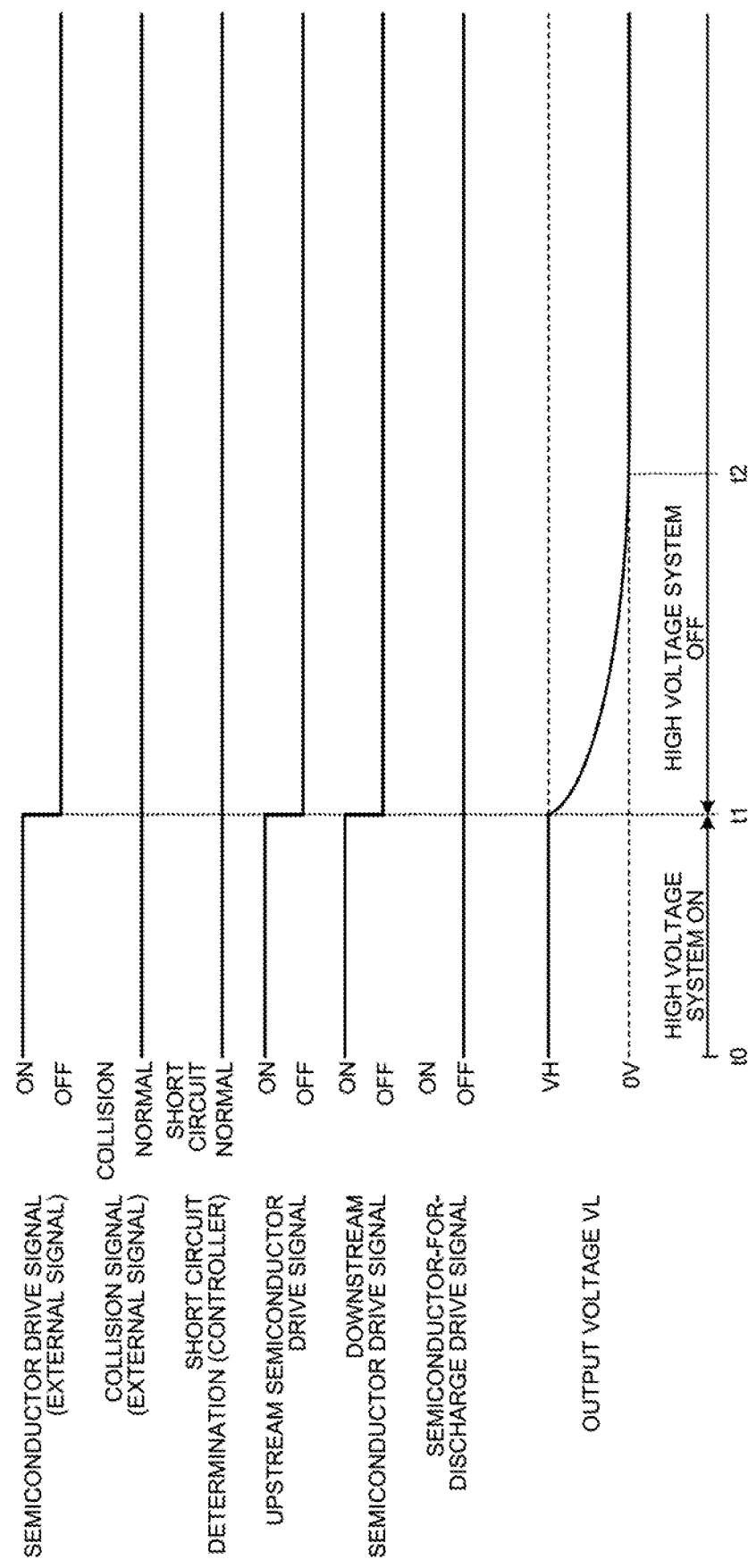
FIG. 2 is a timing chart of an operation example (normal stopping) of the semiconductor relay control device according to the first embodiment.

The following describes an operation example (normal stopping) of the semiconductor relay control device 1 with reference to FIG. 2. This example assumes that in the high voltage system 100, the power supply circuit 101 is in an energized state at a time t0. That is to say, in the high voltage system 100, the FETs 11 and 12 turn on, the FET 13 turns off, and an output voltage VL of the high voltage battery 2 is a stationary voltage VH. In this case, when the semiconductor drive signal (OFF) is output from the external device, the controller 50 of the semiconductor relay control device 1 outputs the upstream semiconductor drive signal (OFF) to the driver 21 to turn off the FET 11 and outputs the downstream semiconductor drive signal (OFF) to the driver 22 to turn off the FET 12 (a time t1). With this control, in the high voltage system 100, the power supply circuit 101 becomes an interrupted state, and the electric charges charged to the capacitor C self-discharge, whereby the output voltage VL of the high voltage battery 2 gradually decreases from the stationary voltage VH to 0 V (the time t1 to a time t2). From the time t0 to the time t1, the high voltage system 100 turns on to make the power supply circuit 101 an energized state. From the time t1 to the time t2, the high voltage system 100 turns off to make the power supply circuit 101 an interrupted state.

Figure 3:
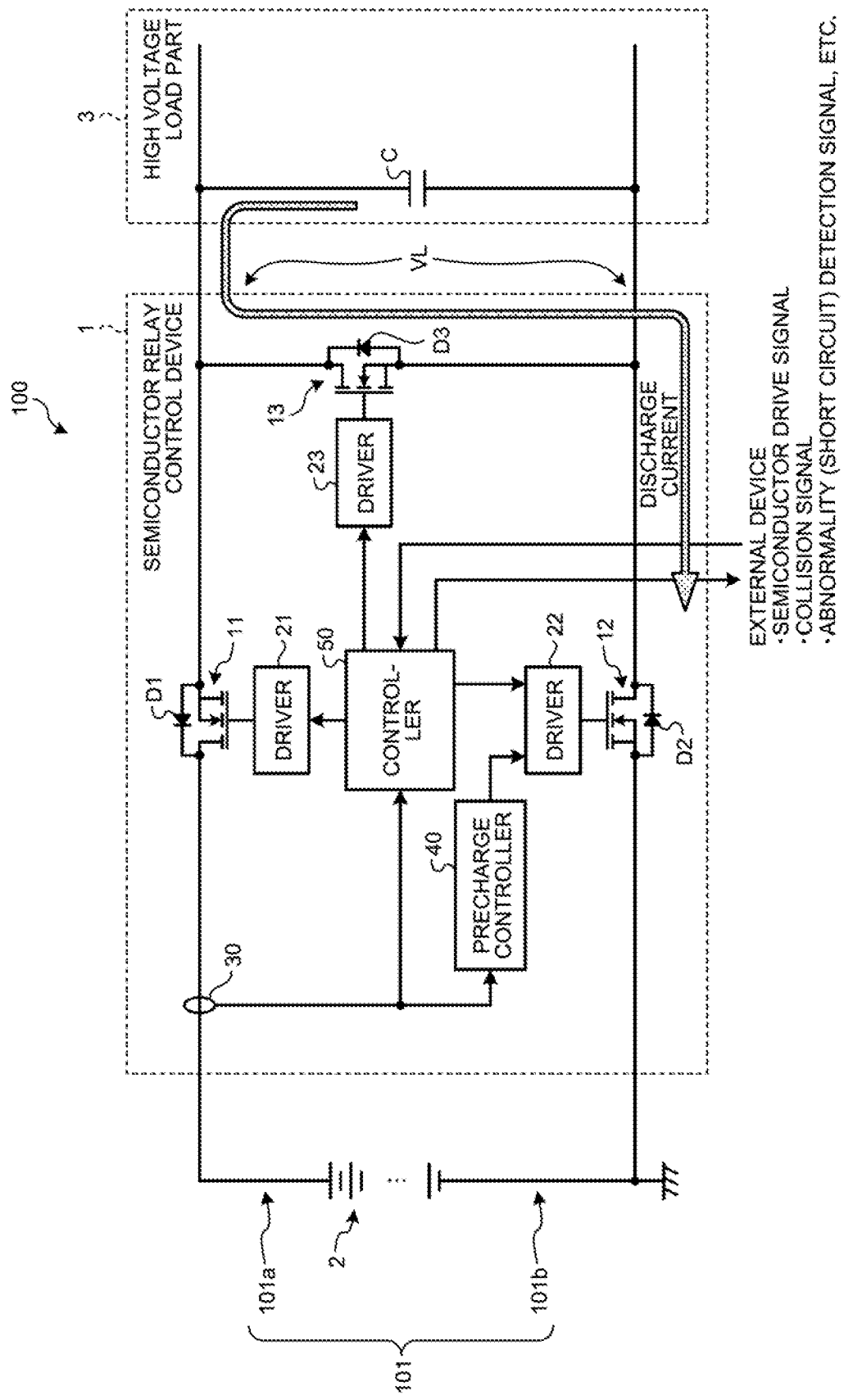
FIG. 3 is a circuit diagram of an operation example (a discharge operation) of the semiconductor relay control device according to the first embodiment.
Figure 4:
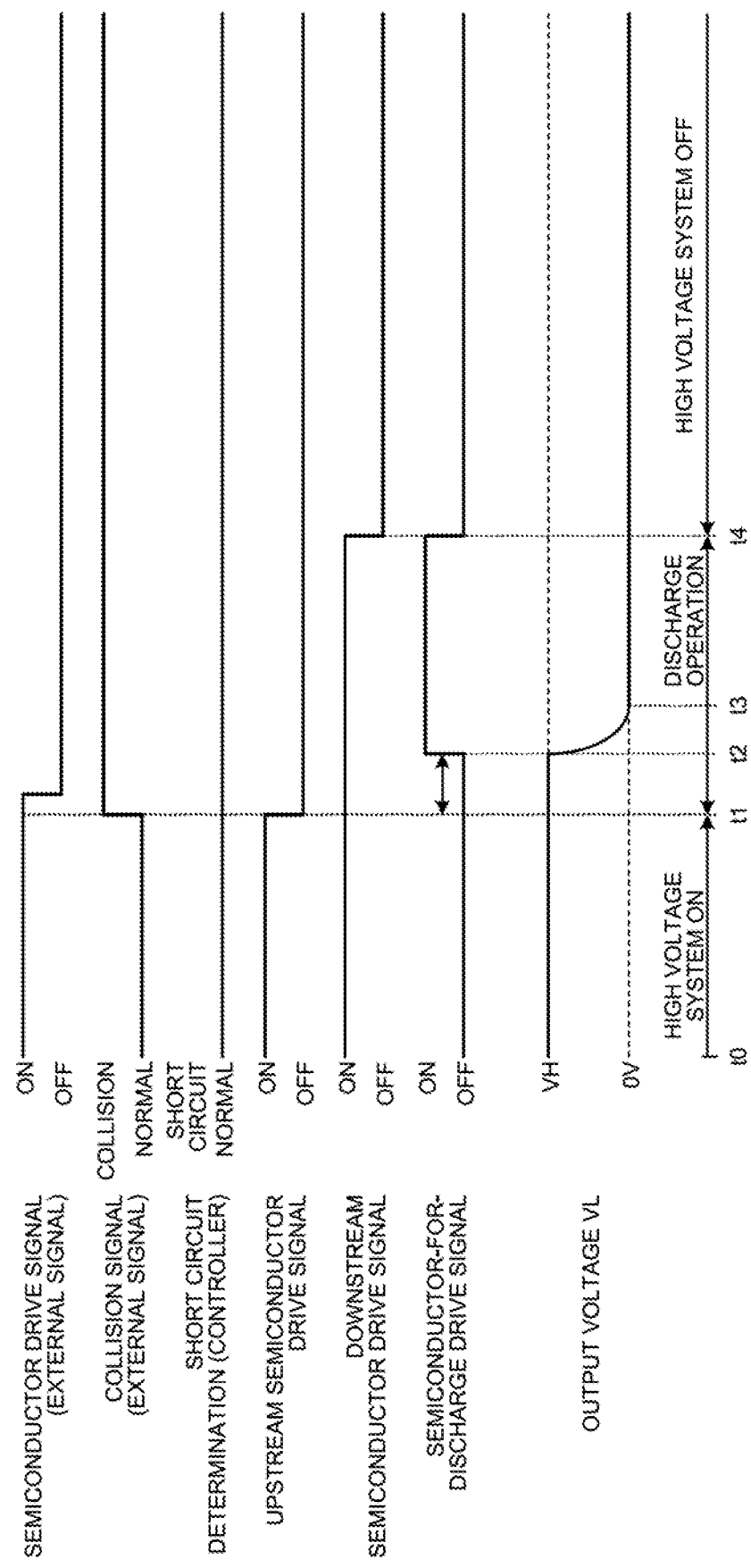
FIG. 4 is a timing chart of the operation example (the discharge operation) of the semiconductor relay control device according to the first embodiment.
Figure 5:
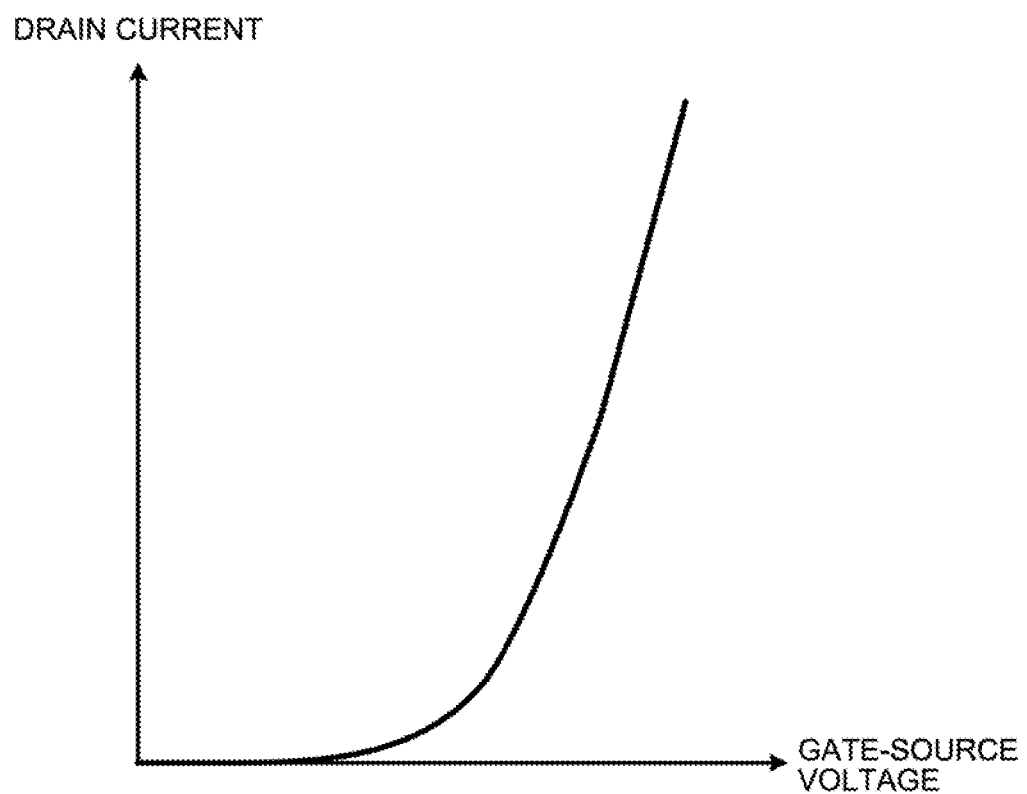
FIG. 5 is a diagram of a relation between a gate-source voltage and a drain current according to the first embodiment.

The following describes an operation example (a discharge operation) of the semiconductor relay control device 1 with reference to FIG. 3 and FIG. 4. This example assumes that in the high voltage system 100, the power supply circuit 101 is in an energized state at a time t0. That is to say, in the high voltage system 100, the FETs 11 and 12 turn on, the FET 13 turns off, and the output voltage VL of the high voltage battery 2 is the stationary voltage VH. In this case, when the collision signal (collision) is output from the external device, the controller 50 of the semiconductor relay control device 1 outputs the upstream semiconductor drive signal (OFF) to the driver 21 to turn off the FET 11 (a time t1). With this operation, the controller 50 makes the power supply circuit 101 an interrupted state. The controller 50 then outputs the semiconductor-for-discharge drive signal (ON) to the driver 23 at a time t2 after a lapse of a certain time from the time t1. The driver 23 applies an ON voltage to the gate terminal of the FET 13 to turn on the FET 13 based on the semiconductor-for-discharge drive signal (ON). With this operation, as illustrated in FIG. 3, the controller 50 can discharge the electric charges charged to the capacitor C. With this discharge, the controller 50 can decrease the output voltage VL of the high voltage battery 2 from the stationary voltage VH to 0 V within a desired time (the time t2 to a time t3). The controller 50 may regulate a discharge current passing through the FET 13. In this case, the controller 50 can limit the discharge current by relatively reducing a voltage to be applied to the gate terminal of the FET 13 (a gate-source voltage) as illustrated in FIG. 5, for example. With this limitation, the controller 50 can inhibit an overcurrent from passing through the power supply circuit 101 at the time of discharge and can prevent the overcurrent from affecting the FET 13 and the like. Upon completion of the discharge of the capacitor C, the controller 50 outputs the downstream semiconductor drive signal (OFF) to the driver 22 to turn off the FET 12 (a time t4) and to completely turn off the high voltage system 100. From the time t0 to the time t1, the high voltage system 100 turns on to make the power supply circuit 101 an energized state. From the time t1 to the time t4, a circuit for discharge turns on to give a discharge state. After the time t4, the high voltage system 100 turns off to make the power supply circuit 101 an interrupted state.

Immediately after the collision signal (collision) is output from the external device, the semiconductor drive signal (OFF) is output from the external device to the controller 50. The reason why the certain time is given between the time t1 and the time t2 when the semiconductor-for-discharge drive signal (ON) is output is to prevent a short circuit. That is to say, when the operation to turn off the FET 11 (the time t1) and the operation to turn on the FET 13 (the time t2) are performed at the same time, the FET 11 and the FET 13 may simultaneously turn on to be short-circuited; the reason is to prevent the short circuit.

Figure 6:
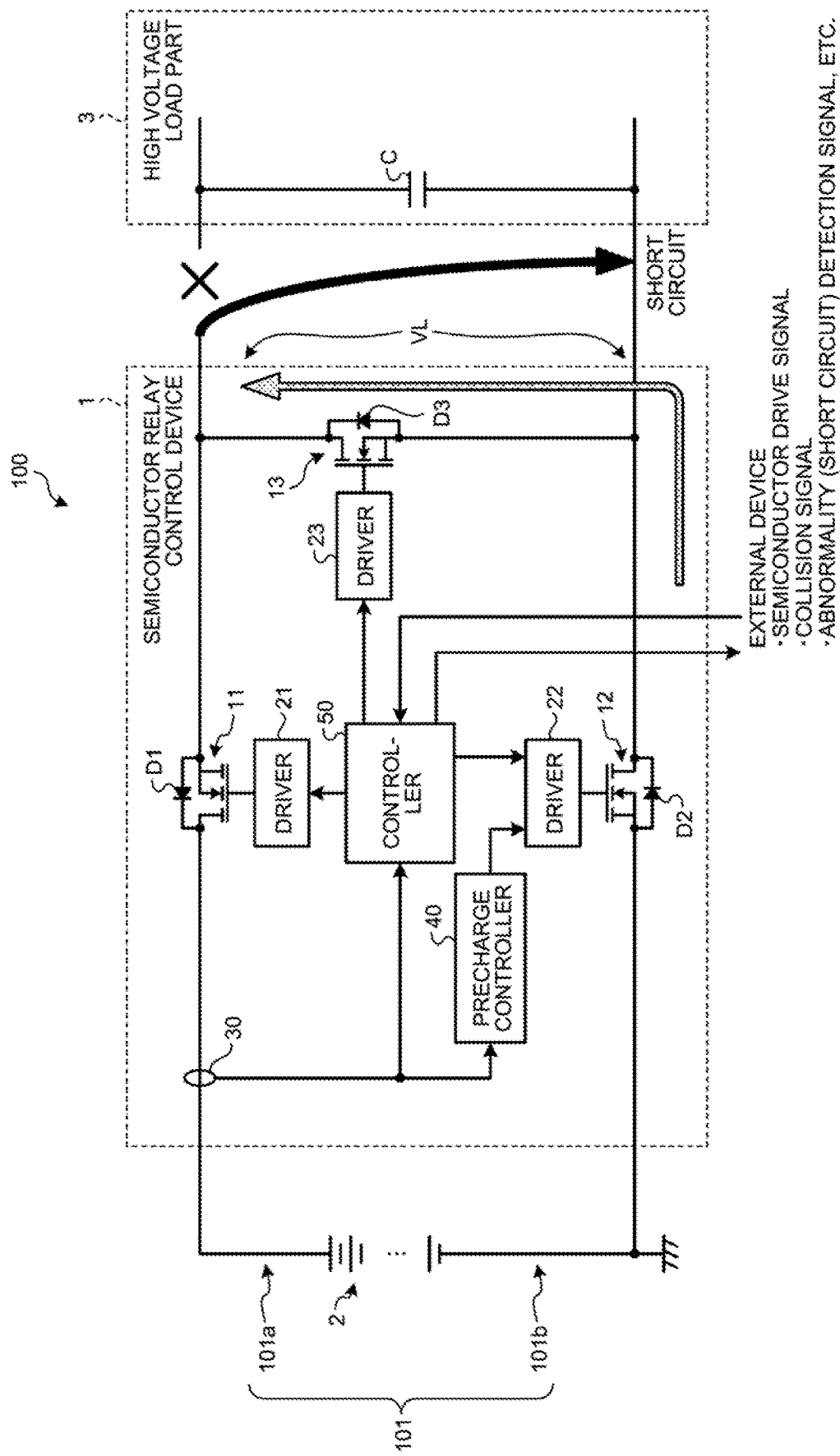
FIG. 6 is a circuit diagram of an operation example (a short circuit operation) of the semiconductor relay control device according to the first embodiment.
Figure 7:
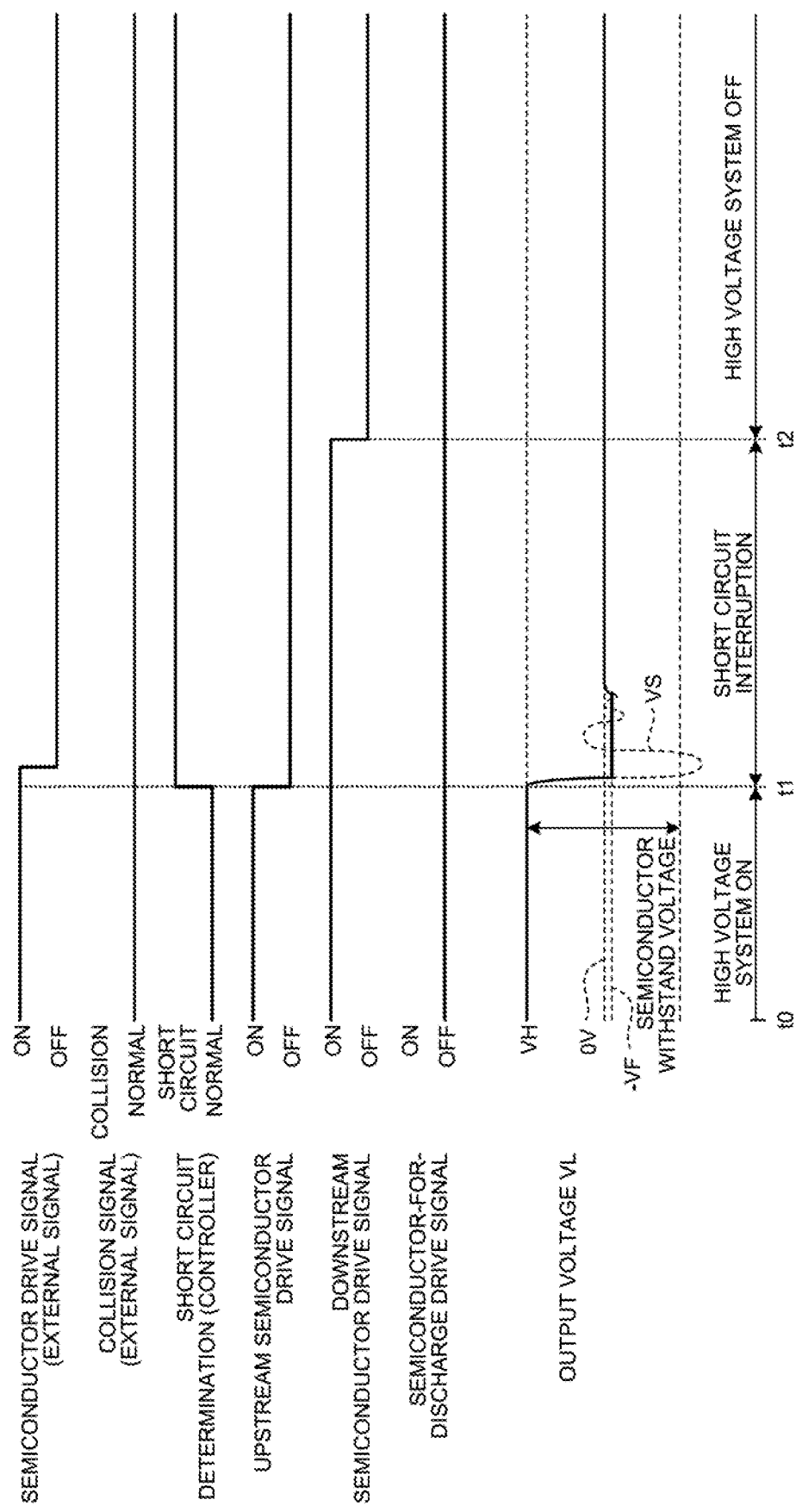
FIG. 7 is a timing chart of the operation example (the short circuit operation) of the semiconductor relay control device according to the first embodiment.
Figure 8:
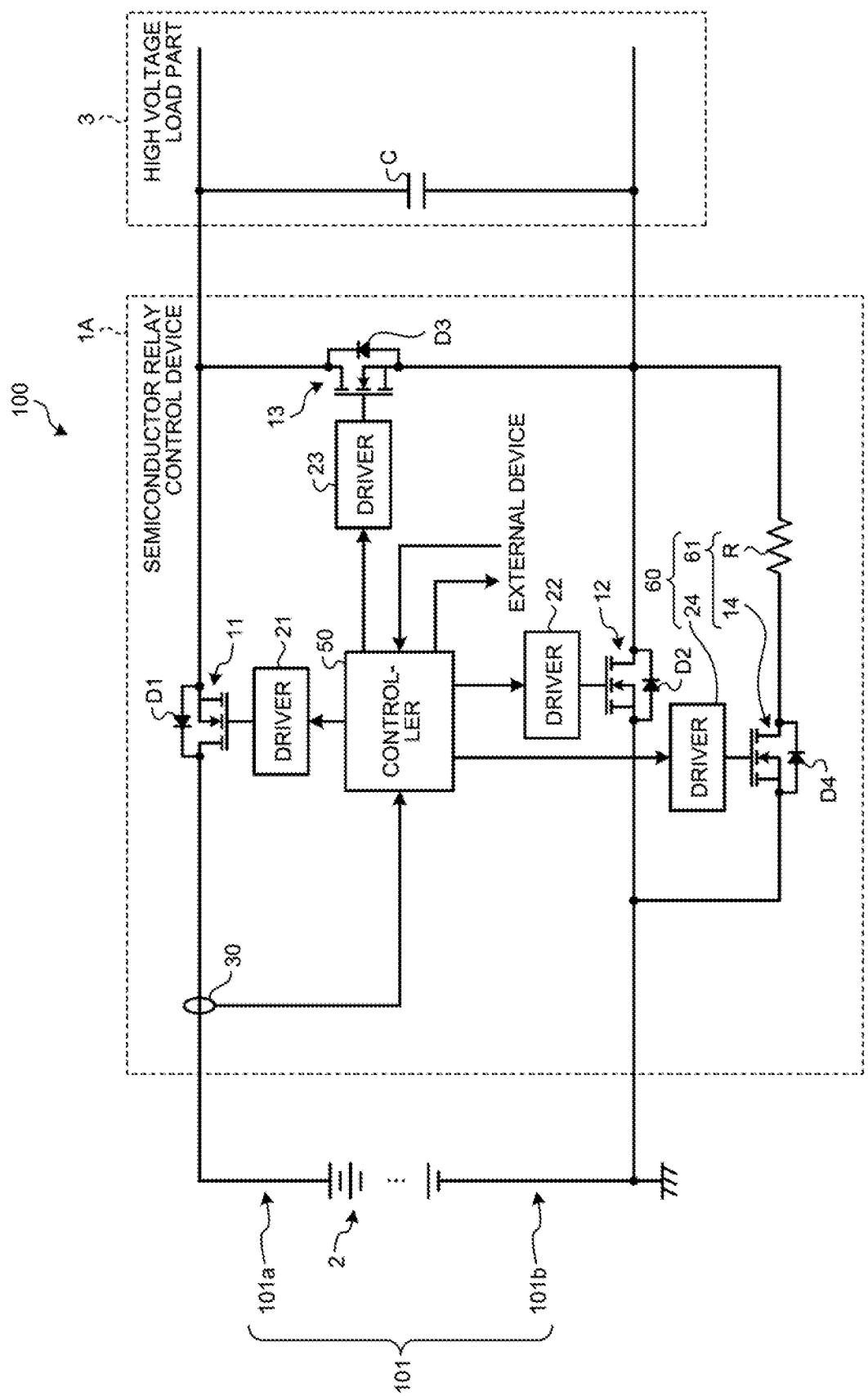
FIG. 8 is a circuit diagram of a configuration example of a semiconductor relay control device according to a second embodiment.

The following describes an operation example (a short circuit operation) of the semiconductor relay control device 1 with reference to FIG. 6 and FIG. 7. This example assumes that in the high voltage system 100, the power supply circuit 101 is in an energized state at a time t0. That is to say, in the high voltage system 100, the FETs 11 and 12 turn on, the FET 13 turns off, and the output voltage VL of the high voltage battery 2 is the stationary voltage VH. In this case, when a short circuit is determined based on the detection current output from the current detector 30, the controller 50 of the semiconductor relay control device 1 outputs the upstream semiconductor drive signal (OFF) to the driver 21 to turn off the FET 11 (a time t1). With this operation, the controller 50 makes the power supply circuit 101 an interrupted state. In this process, as illustrated in FIG. 7, in the high voltage system 100, the turning off of the FET 11 may produce a negative surge voltage in the source terminal of the FET 11. In this case, the controller 50 turns on the FET 12 and turns off the FET 13, and the negative surge voltage is clamped by the body diode D3 of the FET 13. With this operation, the negative surge voltage is reduced by the forward voltage of the body diode D3 of the FET 13. That is to say, the negative surge voltage is reduced to about a voltage lower than the potential of the negative electrode of the high voltage battery 2 illustrated in FIG. 7 by a forward voltage VF of the body diode D3 of the FET 13 (−VF). With this reduction, the controller 50 can prevent the overvoltage of the negative surge voltage from affecting the FET 11 and the like. After reducing the negative surge voltage, the controller 50 outputs the downstream semiconductor drive signal (OFF) to the driver 22 to turn off the FET 12 (a time t2) and to completely turn off the high voltage system 100. From the time t0 to the time t1, the high voltage system 100 turns on to make the power supply circuit 101 an energized state. From the time t1 to the time t2, a circuit for reducing the negative surge voltage turns on to give a state with the negative surge voltage reduced. After the time t2, the high voltage system 100 turns off to make the power supply circuit 101 an interrupted state.

FIG. 7 illustrates a negative surge voltage VS when the negative surge voltage is not clamped by the body diode D3 as a comparative example. This negative surge voltage VS may exceed a semiconductor withstand voltage. When determining a short circuit, the controller 50 outputs an abnormality (short circuit) detection signal to the external device. After outputting the abnormality (short circuit) detection signal to the external device, the semiconductor drive signal (OFF) is output from the external device to the controller 50.

As described above, the power supply circuit 101 according to the first embodiment is a circuit in which the high voltage battery 2 and the high voltage load part 3 are connected to each other and is a circuit in which the capacitor C of the high voltage load part 3 is connected in parallel to the high voltage battery 2. The upstream power supply circuit 101a is a circuit between the positive electrode of the high voltage battery 2 and the high voltage load part 3 in the power supply circuit 101. The semiconductor relay control device 1 includes the FET 11, the FET 12, the FET 13, and the controller 50. The FET 11 is connected in series to between the positive electrode of the high voltage battery 2 and the high voltage load part 3 in the upstream power supply circuit 101a. The FET 11 turns on to make the upstream power supply circuit 101a an energized state and turns off to make the upstream power supply circuit 101a an interrupted state. The FET 12 is connected in series to between the negative electrode of the high voltage battery 2 and the high voltage load part 3 in the downstream power supply circuit 101b between the negative electrode of the high voltage battery 2 and the high voltage load part 3. The FET 12 turns on to make the downstream power supply circuit 101b an energized state and turns off to make the downstream power supply circuit 101b an interrupted state. The FET 13 is connected in parallel to the capacitor C, turns on to make the anode and the cathode of the capacitor C an energized state, and turns off to make the anode and the cathode an interrupted state. The controller 50 controls the FET 11, the FET 12, and the FET 13. The controller 50 turns on the FET 11 and the FET 12 and turns off the FET 13 to make the power supply circuit 101 an energized state. When a certain discharge request is input in the energized state of the power supply circuit 101, the controller 50 turns off the FET 11 and turns on the FET 12 and the FET 13.

With this configuration, when a request to discharge the capacitor C is input at the time of abnormality such as a vehicle collision and an electric leakage, the semiconductor relay control device 1 can quickly discharge the electric charges charged to the capacitor C via the FET 13 and the FET 12, for example. With this discharge, the semiconductor relay control device 1 can reduce the voltage of the capacitor C within a desired time at the time of abnormality and can thus prevent the capacitor C from being exposed to the outside in a state of high voltage. Consequently, the semiconductor relay control device 1 can appropriately address the power supply circuit 101 at the time of abnormality and can thus improve safety.

In the semiconductor relay control device 1, the controller 50 controls the FET 13 to regulate the current passing through the FET 13. With this configuration, the semiconductor relay control device 1 can inhibit an overcurrent from passing through the power supply circuit 101 at the time of discharge and can thus prevent the overcurrent from affecting the FET 13 and the like.

The semiconductor relay control device 1 includes the body diode D3 that is provided so as to have a current passing direction opposite to the direction in which a current passes from the high voltage battery 2 to the high voltage load part 3 and is connected in parallel to the source terminal and the drain terminal of the FET 13. When the power supply circuit 101 is short-circuited, the controller 50 turns off the FET 11 and the FET 13 and turns on the FET 12. With this configuration, the semiconductor relay control device 1 can clamp and reduce the negative surge voltage occurring by the turning off of the FET 11 by the body diode D3. With this reduction, the semiconductor relay control device 1 can prevent the negative surge voltage from affecting the FET 13 and the like. The semiconductor relay control device 1 can achieve the reduction in the negative surge voltage and the discharge of the capacitor C by one FET 13 and can thus reduce a parts count. With this reduction, the semiconductor relay control device 1 can simplify its circuit configuration and curb an increase in circuit size. In addition, the semiconductor relay control device 1 can reduce the cost of manufacturing.

Second Embodiment

The following describes a semiconductor relay device 1A according to a second embodiment. For the second embodiment, components similar to those of the first embodiment are denoted by the same symbols, and a detailed description thereof will be omitted. The semiconductor relay device 1A according to the second embodiment is different from the semiconductor relay control device 1 according to the first embodiment in that current limitation is performed by a resistor. The semiconductor relay device 1A according to the second embodiment includes the FET 11, the FET 12, the FET 13, the controller 50, and a precharge circuit 60. The precharge circuit 60 is a circuit limiting current. The precharge circuit 60 has an FET 14 as a semiconductor relay for precharge, a driver 24, and a resistor R. The precharge circuit 60 forms a series circuit 61 in which the resistor R and the FET 14 are connected in series to each other. The series circuit 61 is connected in parallel to the FET 12. The FET 14 is a switching element passing or interrupting a current passing from the high voltage load part 3 to the negative electrode of the high voltage battery 2. The FET 14 is an N-channel type MOSFET, for example. The FET 14 has a gate terminal, a drain terminal, and a source terminal. The gate terminal of the FET 14 is connected to the driver 24, the drain terminal thereof is connected to the high voltage load part 3 via the resistor R, and the source terminal thereof is connected to the negative electrode of the high voltage battery 2. In the FET 14, an ON voltage is applied to the gate terminal, whereby a current passes between the drain and the source. In the FET 14, an OFF voltage is applied to the gate terminal, whereby no current passes between the drain and the source. The FET 14 is driven by the driver 24 to pass a precharge current via the resistor R. The semiconductor relay device 1A turns on the FETs 11 and 14 and turns off the FETs 12 and 13 to pass a precharge current with the current limited by the resistor R of the precharge circuit 60, for example. The semiconductor relay device 1A turns off the FETs 11 and 12 and turns on the FETs 13 and 14 to discharge the electric charges charged to the capacitor C via the precharge circuit 60. The semiconductor relay device 1A turns on the FETs 11 and 12 and turns off the FETs 13 and 14 to make the power supply circuit 101 an energized state. The semiconductor relay device 1A turns off the FETs 11 to 14 to make the power supply circuit 101 an interrupted state.

As described above, the semiconductor relay device 1A according to the second embodiment includes the FET 11, the FET 12, the FET 13, the precharge circuit 60, and the controller 50. The FET 11 is connected in series to between the positive electrode of the high voltage battery 2 and the high voltage load part 3 in the upstream power supply circuit 101a. The FET 11 turns on to make the upstream power supply circuit 101a an energized state and turns off to make the upstream power supply circuit 101a an interrupted state. The FET 12 is connected in series to between the negative electrode of the high voltage battery 2 and the high voltage load part 3 in the downstream power supply circuit 101b between the negative electrode of the high voltage battery 2 and the high voltage load part 3. The FET 12 turns on to make the downstream power supply circuit 101b an energized state and turns off to make the downstream power supply circuit 101b an interrupted state. The FET 13 is connected in parallel to the capacitor C, turns on to make the anode and cathode of the capacitor C an energized state, and turns off to make the anode and the cathode an interrupted state. The precharge circuit 60 has the series circuit 61 in which the resistor R and the FET 14 are connected in series to each other, with the series circuit 61 connected in parallel to the FET 13. The precharge circuit 60 passes a current through the series circuit 61 by the turning on of the FET 14 and does not pass any current through the series circuit 61 by the turning off of the FET 14. The controller 50 controls the FET 11, the FET 12, the FET 13, and the precharge circuit 60. The controller 50 turns on the FET 11 and the FET 12 and turns off the FETs 13 and 14 to make the power supply circuit 101 an energized state. When the certain discharge request is input in the energized state of the power supply circuit 101, the controller 50 turns off the FETs 11 and 12 and turns on the FETs 13 and 14.

With this configuration, when a request to discharge the capacitor C is input at the time of abnormality such as a vehicle collision and an electric leakage, the semiconductor relay device 1A can discharge the electric charges charged to the capacitor C in a limited manner by the resistor R of the precharge circuit 60, for example. The semiconductor relay device 1A can pass the precharge current by the precharge circuit 60 when the high voltage system 100 is started up.

Modifications

The following describes modifications of the first and the second embodiments. Although examples in which the N-channel type MOSFET is used for the FETs 11 to 14 have been described, this is not limiting; the FETs 11 to 14 may each be a P-channel type MOSFET, an insulated gate bipolar transistor (IGBT), or a transistor, for example. When a semiconductor relay for discharge having no body diode such as the IGBT or the transistor is used in place of the FET 13, a diode in which a forward current passes from the FET 12 toward the FET 11 is required to be connected in parallel to the semiconductor relay for discharge.

Although examples in which the semiconductor relay devices 1 and 1A are installed in a vehicle have been described, this is not limiting; the semiconductor relay devices 1 and 1A may be installed in aircraft, ships, buildings, or the like.

The semiconductor relay device according to the present embodiment turns off the upstream semiconductor relay and turns on the downstream semiconductor relay and the semiconductor relay for discharge when the discharge request is input and can thus discharge electric charges charged to the capacitor and appropriately address the power supply circuit at the time of abnormality.

The semiconductor relay device according to the present embodiment turns off the upstream semiconductor relay and the downstream semiconductor relay and turns on the semiconductor relay for precharge connected to the resistor and the semiconductor relay for discharge when the discharge request is input and can thus discharge the electric charges charged to the capacitor in a limited manner by the resistor and appropriately address the power supply circuit at the time of abnormality.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor relay control device comprising:
an upstream semiconductor relay connected, in an upstream power supply circuit, in a circuit in which a load part including a capacitor and a DC power supply are connected to each other, the circuit being a power supply circuit in which the capacitor is connected in parallel to the DC power supply, between a positive electrode of the DC power supply and the load part, in series to between the positive electrode and the load part, turning on to make the upstream power supply circuit an energized state, and turning off to make the upstream power supply circuit an interrupted state;
a downstream semiconductor relay connected, in a downstream power supply circuit between a negative electrode of the DC power supply and the load part, in series to between the negative electrode and the load part, turning on to make the downstream power supply circuit an energized state, and turning off to make the downstream power supply circuit an interrupted state;
a semiconductor relay for discharge connected in parallel to the capacitor, turning on to make an anode and a cathode of the capacitor an energized state, and turning off to make the anode and the cathode an interrupted state;
a diode that is provided so as to have a current passing direction opposite to a direction in which a current passes from the DC power supply to the load part and is connected in parallel to the semiconductor relay for discharge; and
a controller controlling the upstream semiconductor relay, the downstream semiconductor relay, and the semiconductor relay for discharge, wherein
the controller turns on the upstream semiconductor relay and the downstream semiconductor relay and turns off the semiconductor relay for discharge to make the power supply circuit an energized state and,
when the power supply circuit is short-circuited, the controller turns off the upstream semiconductor relay and the semiconductor relay for discharge and turns on the downstream semiconductor relay, a negative surge voltage caused by the turning off of the upstream semiconductor relay is clamped by the diode.

2. The semiconductor relay control device according to claim 1, wherein
when a certain discharge request is input in the energized state of the power supply circuit, the controller turns off the upstream semiconductor relay and turns on the downstream semiconductor relay and the semiconductor relay for discharge.

3. The semiconductor relay control device according to claim 1, wherein
the controller controls the semiconductor relay for discharge to regulate a current passing through the semiconductor relay for discharge.

4. The semiconductor relay control device according to claim 2, wherein
the controller controls the semiconductor relay for discharge to regulate a current passing through the semiconductor relay for discharge.

5. A semiconductor relay control device comprising:
an upstream semiconductor relay connected, in an upstream power supply circuit, in a circuit in which a load part including a capacitor and a DC power supply are connected to each other, the circuit being a power supply circuit in which the capacitor is connected in parallel to the DC power supply, between a positive electrode of the DC power supply and the load part, in series to between the positive electrode and the load part, turning on to make the upstream power supply circuit an energized state, and turning off to make the upstream power supply circuit an interrupted state;
a downstream semiconductor relay connected, in a downstream power supply circuit between a negative electrode of the DC power supply and the load part, in series to between the negative electrode and the load part, turning on to make the downstream power supply circuit an energized state, and turning off to make the downstream power supply circuit an interrupted state;
a semiconductor relay for discharge connected in parallel to the capacitor, turning on to make an anode and a cathode of the capacitor an energized state, and turning off to make the anode and the cathode an interrupted state;
a precharge circuit having a series circuit in which a resistor and a semiconductor relay for precharge are connected in series to each other, the series circuit being connected in parallel to the downstream semiconductor relay, passing a current through the series circuit by the turning on of the semiconductor relay for precharge, and not passing any current through the series circuit by the turning off of the semiconductor relay for precharge;
a diode that is provided so as to have a current passing direction opposite to a direction in which a current passes from the DC power supply to the load part and is connected in parallel to the semiconductor relay for discharge; and
a controller controlling the upstream semiconductor relay, the downstream semiconductor relay, the semiconductor relay for discharge, and the semiconductor relay for precharge, wherein
the controller turns on the upstream semiconductor relay and the downstream semiconductor relay and turns off the semiconductor relay for discharge and the semiconductor relay for precharge to make the power supply circuit an energized state and,
when the power supply circuit is short-circuited, the controller turns off the upstream semiconductor relay and the semiconductor relay for discharge and turns on the downstream semiconductor relay, a negative surge voltage caused by the turning off of the upstream semiconductor relay is clamped by the diode.

6. The semiconductor relay control device according to claim 5, wherein
when a certain discharge request is input in the energized state of the power supply circuit, the controller turns off the upstream semiconductor relay and the downstream semiconductor relay and turns on the semiconductor relay for precharge and the semiconductor relay for discharge.

* * * * *